United States Patent [19]
Wise et al.

[11] 4,286,228
[45] Aug. 25, 1981

[54] FREQUENCY SPECTRUM NOISE GENERATOR

[75] Inventors: Carl D. Wise; Vincent M. Heazel, Jr., both of Severna Park, Md.

[73] Assignee: Westinghouse Electric Corp., Pittsburgh, Pa.

[21] Appl. No.: 44,792

[22] Filed: May 31, 1979

[51] Int. Cl.³ .......................................... H03B 29/00
[52] U.S. Cl. ........................................ 331/49; 331/78
[58] Field of Search .................... 331/78, 179, 49; 364/717; 343/18 E; 455/1

[56] References Cited
U.S. PATENT DOCUMENTS

| | | |
|---|---|---|
| 3,366,779 | 1/1968 | Catherall et al. ............... 331/78 X |
| 3,659,219 | 4/1972 | Rueff, Jr. ............................. 331/78 |
| 3,899,746 | 8/1975 | Gammel ........................... 331/49 X |
| 4,056,788 | 11/1977 | Brown et al. ....................... 331/78 |

Primary Examiner—Siegfried H. Grimm
Attorney, Agent, or Firm—R. M. Trepp

[57] ABSTRACT

Apparatus for generating noise is described incorporating means for generating a noise frequency spectrum, a plurality of voltage controlled oscillators and means for coupling the voltage controlled oscillators to an output.

The invention overcomes the problem of a single voltage controlled oscillator which could not slue and settle at an appropriate frequency prior to being coupled to an output which resulted in undesired frequencies being generated during this slueing and settling time.

5 Claims, 1 Drawing Figure

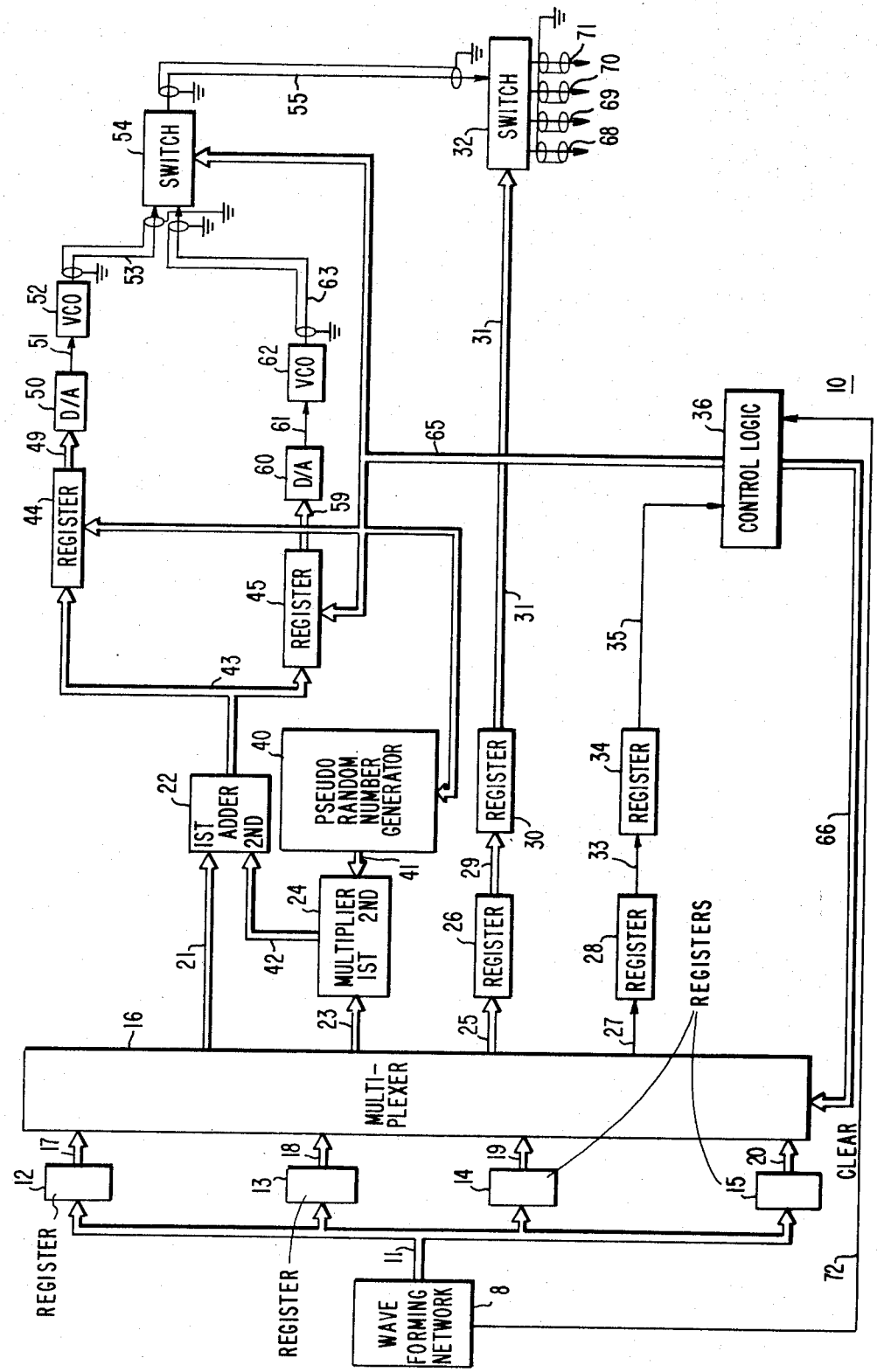

FREQUENCY SPECTRUM NOISE GENERATOR

BACKGROUND OF THE INVENTION

1. Field of the Invention

The present invention relates to noise generators such as radar jammers utilizing voltage controlled oscillators.

2. Description of the Prior Art

In the prior art digital circuitry was used to generate orthogonal sequences of numbers which were converted by a digital to analog converter to a sequence of voltages. The voltage sequences were coupled to a voltage controlled oscillator (VCO) by a high speed analog switch. The voltage controlled oscillator would transform a sequence of voltages to a sequence of frequencies to provide a noise frequency spectrum. One example of digital circuitry used to generate a sequence of voltages to be applied to a voltage controlled oscillator for generating corresponding frequency spectrums was described in U.S. Pat. No. 4,056,788 issued Nov. 1, 1977 entitled "Digital To Analog Noise Generator" by Joel E. Brown and Kelly C. Overman and assigned to the assignee herein.

In U.S. Pat. No. 4,056,788 a sequence of voltages are applied to the input of a voltage controlled oscillator. Each voltage in the sequence, when applied to the VCO, would cause the voltage controlled oscillator to slue or shift to the new frequency wich required a certain amount of time depending upon how far the new frequency corresponding to the new voltage at the input was from the present frequency. The time required for the voltage controlled oscillator to slue or shift to the new frequency corresponding to the new voltage at the input and the time required for the voltage controlled oscillator to settle on the new frequency once the voltage controlled oscillator had slued to it was undesirably long causing an undesirable output of off frequencies during the interim. In other words, the oscillator would be providing a frequency output as it moved from its present frequency to a new frequency. And, once the voltage controlled oscillator reached the new frequency, its frequency would vary about the new frequency until the oscillator had settled or stabilized on the new frequency corresponding to a voltage at its input. The additional frequency outputs which occurred between desired frequency outputs resulted in lower quality signals or off frequencies from the voltage controlled oscillator.

It is therefore desirable to provide a noise generator that provides only the desired frequency outputs.

It is further desirable to provide a noise generator that lessens the requirements of slue rate and settling time of a voltage controlled oscillator utilized in the generator.

It is further desirable to have a high quality noise generator with means for interrupting the noise generated frequencies to provide a frequency output having a duration externally controlled.

It is further desirable in a noise generator to utilize a plurality of voltage controlled oscillators having outputs which may be switched to one or more of a plurality of output terminals.

SUMMARY OF THE INVENTION

In accordance with the present invention, apparatus is provided for generating a sequence of frequency signals from a sequence of signals occurring at predetermined time intervals comprising first and second means for alternately storing signals occurring during predetermined time intervals, third means responsive to the signals stored in the first means for generating a first frequency signal, fourth means responsive to the signals stored in the second means for generating a second frequency signal and means responsive to the occurrence of the time intervals for alternately coupling the first and second frequency signals to an output.

The invention further provides apparatus for generating noise comprising means for generating a noise frequency spectrum represented by a sequence of discrete voltages occurring at predetermined time intervals, a plurality of voltage controlled oscillators each having an output, means for coupling a first discrete voltage to a first voltage controlled oscillator to provide a first frequency at the output in response to the discrete voltage during a first time interval, means for coupling a second discrete voltage to a second voltage controlled oscillator to provide a second frequency at the output in response to the discrete voltage during a second time interval, and means for coupling the outputs of the first and second voltage controlled oscillators to an output terminal.

BRIEF DESCRIPTION OF THE DRAWING

The drawing shows one embodiment of the invention.

DESCRIPTION OF THE PREFERRED EMBODIMENTS

Referring now to the drawing, wave forming network 8 provides a source of input signals to noise generator 10. Wave forming network 8 is coupled over line 11 to an input of registers 12 through 15. Registers 12 through 15 function to hold input signals from wave forming network 8. Registers 12 through 15 are each coupled to multiplexer 16 over lines 17 through 20, respectively. Multiplexer 16 functions to hold an input signal selected from one of registers 12 through 15. Multiplexer 16 may for example transfer a plurality of bits such as 16. Multiplexer 16 is coupled over line 21 to adder 22. Miltiplexer 16 is coupled over line 23 to multiplier 24. Multiplexer 16 is coupled over line 25 to register 26. Multiplexer 16 is coupled over line 27 to register 28. The output of register 26 is coupled over line 29 to an input of register 30. The output of register 30 is coupled over line 31 to a control input of switch 32. The output of register 28 is coupled over line 33 to an input of register 34. The output of register 34 is coupled over line 35 to an input of control logic 36.

Pseudo random number generator 40 which functions to provide a signal indicative of a sequence of pseudo random numbers is coupled over line 41 to a second input of multiplier 24. The output of multiplier 24 is coupled over line 42 to a second input of adder 22. The output of adder 22 is coupled over line 43 to an input of registers 44 and 45. The output of register 44 is coupled over line 49 to an input of digital to analog converter 50. The output of digital to analog converter 50 is coupled over line 51 to an input of voltage controlled oscillator 52. The output of voltage controlled oscillator 52 is coupled over line 53 to an input of switch 54. The output of switch 54 is coupled over line 55 to an input of switch 32.

The output of register 45 is coupled over line 59 to an input of digital to analog converter 60. The output of digital to analog converter 60 is coupled over line 61 to an input of voltage controlled oscillator 62. The output of voltage controlled oscillator 62 is coupled over line 63 to an input of switch 54. An output of control logic 36 is coupled over line 65 to a control input of pseudo random number generator 40, register 45, register 44 and switch 54. A control output of control logic 36 is coupled over line 66 to a control input of multiplexer 16. Voltage controlled oscillators 52 and 62 may for example have an octave bandwidth and operate for example at gigahertz frequencies, such as from 2 to 4 GHz.

Switch 32 has output ports by way of lines 68 through 71. Wave forming network 8 has a clear control signal coupled over line 72 to an input of control logic 36.

In the operation of noise generator 10, wave forming network 8 supplies input signals to registers 12 through 15. Wave forming network 8 may for example be external to noise generator 10 such as a parameter storage memory addressed by or within utilization devices which interface with noise generator 10 over line 11 to specify the parameters of noise desired by the utilization device from noise generator 10 by communicating those parameters over line 11 to registers 12 through 15. For example, registers 12 through 15 may each hold information indicative of parameters of a particular noise spectrum. Each register 12 through 15 may therefore contain parameters to specify a unique noise spectrum which may include directing which channel or lines 68 through 71 the particular noise spectrum is to appear on.

Examples of the parameters which may be contained in register 12 may be for example the center frequency, bandwidth, output channel, and dwell request.

Control logic 36 functions to cause appropriate address signals on line 66 to cause multiplexer 16 to select registers 12, 13, 14 and 15 in sequence. When register 12 is selected by multiplexer 16, parameter information contained in register 12 is coupled to lines 21, 23, 25 and 27. For example, center frequency information is coupled over line 21. Bandwidth information is coupled over line 23. Output channel information is coupled over line 25. And dwell request information is coupled over line 27. By sequencing through registers 12 through 15 in order and repeating the sequence continually, four noise spectrums may be generated by noise generator 10 which may be coupled out on one or more of output lines 68 through 71.

Pseudo random number generator 40 may for example be a digital shift register having feedback connections to generate orthogonal sequences or pseudo random number sequences. Pseudo random number generator 40 may also for example be obtained from a table of numbers stored in a memory or from a thermal diode and an analog to digital converter to provide a random number sequence in digital form. The output of pseudo random number generator 40 is multiplied by multiplier 24 with the bandwidth parameter on line 23 to provide an output on line 42 which is added with the center frequency parameter on line 21 to provide an output voltage having a discrete voltage occurring at a predetermined time interval such as T1. Successive multiplications by multiplier 24 utilizing different values from pseudo random number generator 40 provides a sequence of discrete values on line 42 which may be added by adder 22 to the center frequency parameter on line 21 to provide a noise frequency spectrum having a sequence of discrete voltages occurring at predetermined time intervals such as T1, T2, T3 ... Tn where n is an integer. The time intervals T1 through Tn are determined by control logic 36 which provides a clock or control signal to pseudo random number generator 40 which causes pseudo random number generator 40 to provide a new value on line 41. Control logic 36 also causes registers 44 and 45 to alternately clock in the value on line 43. For example, during even time intervals such as T2, T4, T6, values on line 43 may be clocked into register 44. During time intervals T1, T3, T5 values on line 43 may be clocked into register 45. At the time values on lines 43 are clocked into either register 44 or 45, pseudo random number generator 40 may provide a new value on line 41 which will pass through multiplier 24 and adder 22 to provide a new value on line 43 to be clocked into register 44 or 45 at the start of the next time interval. When a new value is clocked into register 44, register 44 holds the value and the value is coupled over line 49 to D/A converter 50 which provides an analog voltage signal on line 51 to voltage controlled oscillator 52. Voltage controlled oscillator 52 functions to provide a frequency on line 53 in response to the discrete analog voltage on line 51. This for example may occur during interval time T2.

For best performance, time interval T2 would have sufficient time to allow the voltage on line 51 to stabilize and to permit voltage controlled oscillator 52 to slue to the frequency in response to the voltage on line 51 and to settle at that frequency to provide a constant frequency signal on line 53 by the time time interval T3 begins. At time interval T3 control logic 36 causes switch 54 to couple line 53 to line 55.

At time interval T3 register 45 stores the value on line 43 and couples that value on line 59 to D/A converter 60. D/A converter 60 provides a voltage on line 61 to voltage controlled oscillator 62 which slues to a frequency on output line 63 in response to the voltage on line 61. At time interval T4, control logic 36 causes switch 54 to couple line 63 to line 55.

The frequency signal on line 55 is coupled to switch 32 to one or more output lines 68 through 71. At the time interval that parameter data is fed on lines 21 and 23, a parameter for switch 32 directing one or more output channels to be coupled to line 55 is provided on line 25 to register 26 which holds the information during the first time interval. At the second time interval the information held in register 26 is coupled over line 29 to register 30 which functions to hold the data for a second time period. During the third time interval when the frequency corresponding to the parameter data on lines 21 and 23 is coupled to line 55, the contents of register 30 is coupled over line 31 to switch 32 which directs one or more output lines 68 through 71 to be coupled to the frequency on line 55. Switch 32 as well as switch 54 are switches suitable for switching RF signals which are well known in the art.

Multiplexer 16 also may provide a dwell request on line 27 at the time parameter data is transferred from one of registers 12 through 15 which is stored in register 28 during a first time interval. During a second time interval the information in register 28 is coupled over line 33 to register 34 and held during a second time interval. During the third time interval the contents of register 34 or dwell request signal is coupled over line 35 to control logic 36 which inhibits or interrupts control logic 36 from generating signals over lines 66 and 65. The frequency on line 55 is therefore a stable frequency which remains until wave forming network 8 clears or resets control logic 36 by a signal over line 72 to enable the appropriate control signals on lines 66 and 65 to begin. A dwell request signal on line 27 therefore after two time intervals allows a frequency on line 55 to be coupled to one or more of the output lines 68 through 71 for a duration of time which will continue until a clear signal on line 72 causes control logic 36 to resume appropriate control signals on lines 66 and 65 which will cause new values to be presented to the inputs of the voltage controlled oscillators 52 and 62 and subsequently be switched to line 55.

Apparatus for generating noise has been described incorporating means for generating a noise frequency spectrum represented by a sequence of discrete voltages occurring at predetermined time intervals, a plurality of voltage controlled oscillators each having an output, means for coupling a first discrete voltage to a first voltage controlled oscillator to provide a first frequency at the output in response to the discrete voltage during a first time interval, means for coupling a second discrete voltage to a second voltage controlled oscillator to provide a second frequency at the output in response to the discrete voltage during a second time interval, and means for coupling the output of the first and second voltage controlled oscillators to an output terminal.

We claim:

1. Apparatus for generating noise comprising:
   means for generating a noise frequency spectrum represented by a sequence of discrete voltages occurring at predetermined time intervals,
   a plurality of voltage controlled oscillators, each having an output,
   first means for coupling a first discrete voltage from said sequence of discrete voltages to a first voltage controlled oscillator to provide a first frequency at said output in response to said first discrete voltage during a first time interval,
   second means for coupling a second discrete voltage from said sequence of discrete voltages to a second voltage controlled oscillator to provide a second frequency at said output in response to said second discrete voltage during a second time interval,
   an outut terminal, and third means for coupling said outputs of said first and second voltage controlled oscillators to said outut terminal.

2. The apparatus of claim 1 further including at least a second output terminal to form a plurality of output terminals, and wherein said third means includes fourth means for coupling said voltage controlled oscillator outputs one at a time to one or more of said plurality of output terminals.

3. The apparatus of claim 1 wherein said means for generatng includes a source of predetermined constants,
   means responsive to said predetermined constants to provide a frequency bandwidth signal and a center frequency signal, a random number generator to provide a sequence of random numbers, and
   means for arithmetically combining said sequence of random numbers with said frequency bandwidth signal and said center frequency signal.

4. The apparatus of claim 3 further including a source of predetermined constants,
   means responsive to said predetermined constants for extending said first time interval,
   a signal source, and means responsive to said signal for terminating said first time interval.

5. The apparatus of claim 2 further including a source of predetermined constants and wherein said fourth means for coupling is responsive to said predetermined constants for coupling said voltage controlled oscillator outputs one at a time to one or more of said plurality of output terminals.

* * * * *